(12) United States Patent
Zhou et al.

(10) Patent No.: US 7,919,749 B2
(45) Date of Patent: Apr. 5, 2011

(54) ENERGY FILTER FOR COLD FIELD EMISSION ELECTRON BEAM APPARATUS

(75) Inventors: Fang Zhou, Feldkirchen (DE); Juergen Frosien, Riemerling (DE); Pavel Adamec, Haar (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 253 days.

(21) Appl. No.: 12/234,453

(22) Filed: Sep. 19, 2008

(65) Prior Publication Data
US 2009/0101819 A1    Apr. 23, 2009

(30) Foreign Application Priority Data
Oct. 17, 2007    (EP) .................................. 07020340

(51) Int. Cl.
*H01J 37/244*    (2006.01)
(52) U.S. Cl. ..................... 250/305; 250/310; 250/396 R
(58) Field of Classification Search .................. 250/305, 250/306, 307, 310, 396 R
See application file for complete search history.

(56) References Cited

U.S. PATENT DOCUMENTS

| 6,111,253 A | 8/2000 | Tsuno | |
|---|---|---|---|
| 7,439,500 B2 * | 10/2008 | Frosien et al. | 250/305 |
| 2001/0052744 A1 | 12/2001 | Tsuno | |

FOREIGN PATENT DOCUMENTS

| EP | 0989584 A1 | 3/2000 |
|---|---|---|
| EP | 1 517 353 | 3/2005 |
| WO | 2004021391 A1 | 3/2004 |

OTHER PUBLICATIONS

Extended European Search Report dated Jun. 17, 2008.
E. G. Borgonjen et al., "A novel vacuum electron source based on ballistic electron," Applied Surface Science, 1997 vol. 111: pp. 165-169.
I. S. Stepanov et al., "Fabrication of Ultra-Thin Free-Standing Chromium Foils Supported by a Si3n4 Membrane-Structure with Search Pattern," Microelectronic Engineering, 1999 vol. 46: pp. 435-438.
Examination Report dated Nov. 19, 2010 for European Patent Application No. 07020340.1.

* cited by examiner

*Primary Examiner* — Kiet T Nguyen
(74) *Attorney, Agent, or Firm* — Patterson & Sheridan, L.L.P.

(57) ABSTRACT

An electron beam apparatus and a method for providing an energy-filtered primary electron beam are described. Therein, a primary electron beam having an asymmetric first energy distribution is generated by means of an electron source. The primary electron beam is high-pass energy filtered using a retarding lens.

25 Claims, 4 Drawing Sheets

ENERGY FILTER FOR COLD FIELD EMISSION ELECTRON BEAM APPARATUS

CROSS-REFERENCE TO RELATED APPLICATION

This application claims priority to European Patent Application Serial No. 07020340.1 filed on Oct. 17, 2007, which is herein incorporated by reference in its entirety.

FIELD OF THE INVENTION

The invention generally relates to an electron beam apparatus, e.g., for inspection applications, testing applications, lithography applications and the like. More particularly, it relates to a cold field emission electron beam apparatus having an energy filter. The invention further relates to a method for providing an energy-filtered primary electron beam.

BACKGROUND OF THE INVENTION

Electron beam apparatuses have many functions in a plurality of industrial fields, in particular in fields having a high demand for structuring and inspecting specimens within the micrometer and nanometer scale. Typical applications of electron beam apparatuses include inspection of semiconductor apparatuses during manufacturing, exposure systems for lithography, detecting apparatuses and testing systems. Electron beams offer superior spatial resolution compared to e.g., photon beams, due to their short wavelengths.

An important factor limiting the spatial resolution of electron beam apparatuses is the chromatic aberration of the electron optical system. The chromatic aberration can be reduced by reducing the energy spread of the electron beam. To reduce the energy spread, very expensive and complicated monochromators have been designed. These monochromators have the further disadvantage of reducing the beam intensity considerably.

When electron sources based on field emission are used, the energy spread is generally smaller than that of thermal electron sources. Such field emission electron sources are used e.g., in low voltage scanning electron microscopes (LVSEMs), wherein low voltage is generally defined as a voltage of less than 5 keV, in particular less than 1 keV. However, there remains the desire to further reduce the energy spread of the electron beam using simple and cost-effective means e.g., in order to further reduce chromatic aberrations.

SUMMARY OF THE INVENTION

In light of the above, the present invention intends to provide an improved electron apparatus, and an improved method for providing an energy-filtered primary electron beam.

The object is solved by the method for providing an energy-filtered primary electron beam according to independent claim 1, and by the electron beam apparatus according to independent claims 12 and 18.

According to one embodiment, a method for providing an energy-filtered primary electron beam comprises generating a primary electron beam having an asymmetric energy distribution by means of an electron source; and high-pass energy filtering the primary electron beam using a retarding lens. In this and other embodiments, the combination of an asymmetric energy distribution, which is typically found when e.g., a cold field emission electron source is used, and of the high-pass filtering may allow reducing the energy spread while keeping a relatively large fraction of the original electron beam intensity. Further, the retarding lens can be designed as a compact arrangement and produced at low cost, especially when compared to monochromators of the prior art.

According to another embodiment, an electron beam apparatus comprises the following elements: a cold field emission electron source for providing a primary electron beam, the cold field emission electron source comprising a cold field emitter; a retarding lens adapted to be a high-pass energy filter for the primary electron beam; a first voltage supply for supplying a first voltage to the cold field emitter; and a second voltage supply connected to the retarding lens for supplying a second voltage to the retarding lens. The second voltage supply is in communication with the first voltage supply, e.g., for relating the second voltage and the first voltage to each other. In this embodiment, the voltages of the cold field emitter and of the retarding lens may be coordinated, thereby facilitating a high-pass filtering action of the retarding lens.

According to a further embodiment, an electron beam apparatus comprises the following elements: a cold field emission electron source for providing a primary electron beam; a beam-limiting aperture for the primary electron beam; and a retarding lens placed, in primary electron beam direction, after the beam-limiting aperture. The retarding lens is adapted to be a high-pass energy filter for the primary electron beam. In this embodiment, the beam-limiting aperture may reduce the primary electron beam intensity, whence a possible unwanted energy spreading of the electron beam traversing the retarding lens e.g., due to the Boersch effect may be reduced.

Further advantages, features, aspects and details that can be combined with the above embodiments are evident from the dependent claims, the description and the drawings.

Embodiments are also directed to apparatuses for carrying out the disclosed methods and include apparatus parts for performing each described method step. These method steps may be performed by way of hardware components, a computer programmed by appropriate software, by any combination of the two or in any other manner. Furthermore, embodiments are also directed to methods by which the described apparatuses operate. It includes method steps for carrying out every function of the apparatuses or manufacturing every part of the apparatuses.

BRIEF DESCRIPTION OF THE DRAWINGS

Some of the above and other more detailed aspects of the invention will be described in the following description and partially illustrated with reference to the figures. Therein.

DETAILED DESCRIPTION OF THE DRAWINGS

Within the following description of the drawings, the same reference numbers refer to the same components. Generally, only the differences with respect to the individual embodiments are described.

Figure 1:
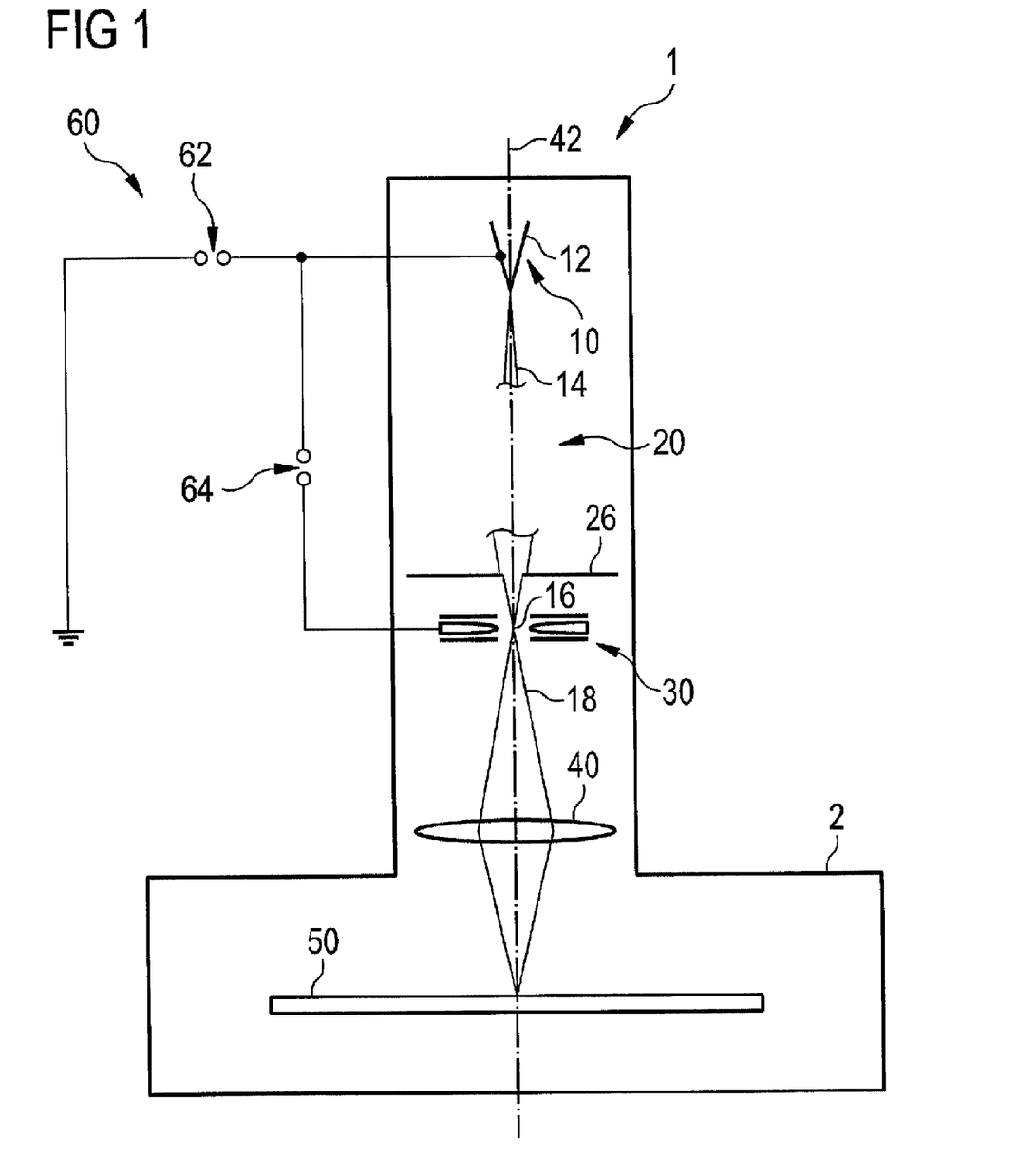
FIG. 1 shows a schematic view of parts of a first embodiment of an electron beam apparatus.

FIG. 1 shows a schematic view of parts of a first embodiment of an electron beam apparatus 1 according to the present invention. The electron beam apparatus 1 may be the used for inspection or lithography, and may specifically be a scanning electron microscope, more specifically a low voltage scanning electron microscope. It comprises a housing 2, a primary electron beam source 10, beam-shaping means 20, a retarding lens 30, an objective lens 40, a holder for a specimen 50, and a control system 60.

The primary electron beam source 10 comprises a cold field emitter 12 for emitting a primary electron beam 14 along an optical axis 42 of the apparatus. The cold field emitter 12 may comprise e.g., a single crystal tungsten tip or a similar field emitter tip as known in the art.

The beam-shaping means 20 comprises an aperture 26. An "aperture" as referred to herein, is not to be understood as any kind of opening, like a lens mount, a part of the column housing or parts that might only theoretically delimit a beam. An aperture is to be understood as a beam-limiting aperture for reducing the primary electron beam intensity, or beam current. The aperture may especially be introduced in order to delimit the size of a charged particle beam, i.e., an aperture diaphragm. In light thereof, the aperture 26 opening is generally of the order of, or smaller than, a typical beam diameter, in particular smaller than 1 mm, e.g., less than 700 µm or 2 µm to 700 µm.

Figure 3:
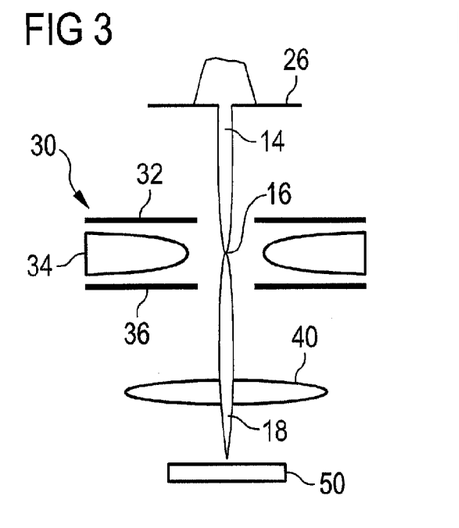
FIG. 3 shows an enlarged view of some of the parts of the embodiment shown in FIG. 1.

Further parts of the beam-shaping means 20 are not shown in detail, but generally comprise one or more accelerating anodes, condenser lenses, and voltage supplies thereto. A possible arrangement of a condenser lens system upstream of the retarding lens 30 and of an additional demagnifying lens system downstream of the retarding lens 30 is described with reference to FIGS. 6 and 7 (see below), and may be provided in the embodiment of FIG. 1 as well. With condenser lenses, the electron beam 14 generally converges before the retarding lens 30, as shown in FIG. 1. Without condenser lenses, the electron beam 14 generally diverges as shown in FIG. 3.

Further, the beam-shaping means 20 may comprise an alignment element for aligning the beam spot position. The alignment element generally comprises two deflectors adapted for deflecting the electron beam. The two deflectors are, for example, adapted and controlled for deflecting the beam by respective deflecting angles that are equal in magnitude but opposite in direction, such as to offset the beam laterally. The alignment element allows the operator to align the beam 14 accurately with the center of the retarding lens 30.

Any aperture-like elements of the beam shaping means 20 are generally arranged, in beam 14 direction before the aperture 26, which is thus generally a final aperture.

The objective lens 40 is shown schematically and is provided as known in the art. While the objective lens 40 is shown as a conical lens, it may also be provided e.g., as an immersion lens. It may comprise one or more lens stages. The objective lens 40 defines the optical axis 42 of the electron beam apparatus 1. Further, a beam scanning arrangement (not shown) may be provided before or after the objective lens 40, or overlapping with the objective lens 40.

Further, a holder for a specimen 50 is provided. The term "specimen" as referred to herein, includes semiconductor wafers, semiconductor workpieces, and other workpieces such as optical blanks, memory disks and the like. Embodiments of the invention may be applied to any workpiece on which material is deposited, which is structured, or which is to be inspected.

The electron beam apparatus 1 further includes a retarding lens 30. The retarding lens 30 is placed at a cross-over 16 position of the primary electron beam 14. The cross-over 16 may be generated e.g., by the beam-shaping means 20 (e.g., by a condenser lens system), or by the retarding lens 30 itself, i.e., is not present when the retarding lens 30 is in an "off" state.

In the following, the function of the retarding lens 30 is described in more detail. $e<0$ denotes the electron charge. A retarding voltage $U_{ret}$ is supplied to the retarding lens 30, specifically to retarding lens 30 electrodes. Thereby, an electrostatic saddle potential is created for the electrons passing the retarding lens, having a saddle point voltage, or potential, $U_{saddle}$ at the saddle point. The potential energy at the saddle point, $e \times U_{saddle}$, is generally somewhat below the potential energy at the retarding lens 30 electrodes, $e \times U_{saddle} = e \times U_{ret} - \Delta E_{saddle}$, where $\Delta E_{saddle} \geq 0$.

The total energy (i.e., kinetic plus potential energy) of an electron emitted from the cathode tip is $E_{tot} = E_{kin,cat} + e \times U_{cat}$, where $U_{cat}$ is the cathode potential applied to the field emission tip 12. When scattering and interactions are neglected, the electron can only pass the retarding lens if $E_{tot} \geq e \times U_{saddle}$. The above condition for passing the retarding lens 30 can be rephrased as $E_{kin,cat} \geq e \times U_{saddle} - e \times U_{cat}$. For this reason, the energy $E_{th} = e \times U_{saddle} - e \times U_{cat}$ is also referred to as a threshold energy.

Lower-energy electrons cannot pass and are typically reflected, i.e., deflected by more than 90°. Thus, the retarding lens 30 acts on the primary electron beam 14 as a high-pass energy filter. Thereby, the electron beam 14 is turned into an energy-filtered electron beam 18. The above energy filtering action can be paraphrased as adjusting an energy spread of the primary electron beam 18 emerging from the retardation lens 30 by supplying a suitable retardation voltage $U_{ret}$ to the retardation lens 30.

Figure 2:
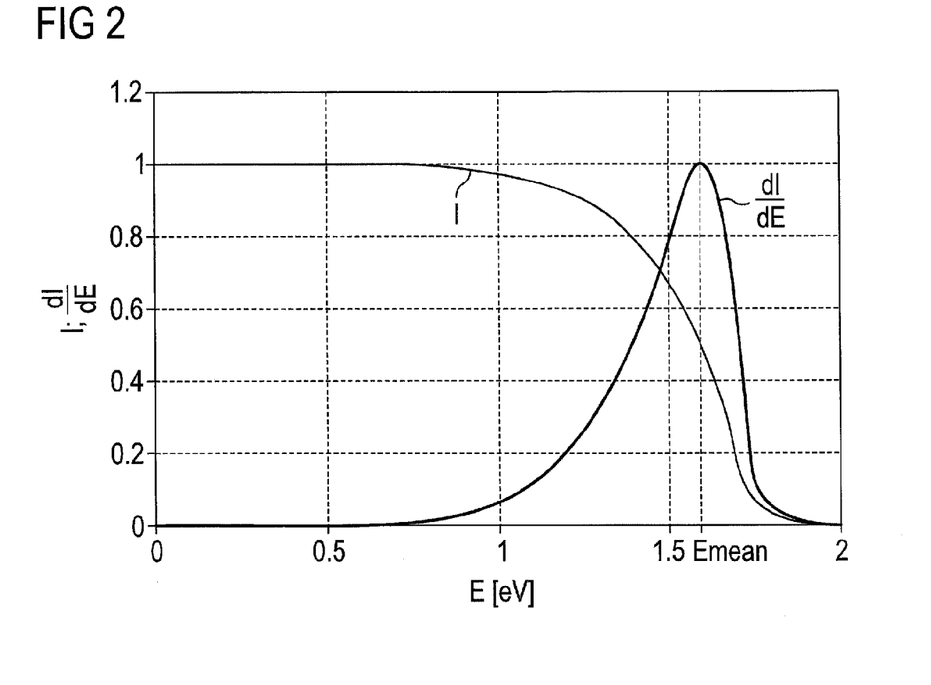
FIG. 2 is a diagram showing the beam current transmitted through the retarding lens as a function of threshold energy, and its derivative.

The effect of the high-pass energy filtering of the retarding lens 30 is better understood in connection with the graph of FIG. 2. Therein, the curve referred to as "dI/dE" represents the current density, per unit energy, of an electron beam emitted from a typical cold field electron emitter 12, as a function of kinetic energy $E_{kin,cat}$ at the time of emission.

The curve referred to as "I" is the total current traversing the retarding lens 30 after being high-pass energy filtered with a threshold energy $E_{th}$, as a function of the threshold energy $E_{th}$. The curve "I" thus is the integral of the beam energy distribution dI/dE from $E_{th}$ to infinity. In FIG. 2, the units of the y-axis are normalized to 1.

The energy distribution dI/dE shown in FIG. 2 is seen to be highly asymmetric, the rise of the energy distribution at the high energy side of the curve being much steeper than the corresponding rise at the low energy side. Here, an asymmetric energy distribution is defined by the energy spread on the low-energy side of the mean energy being different from, and in particular higher than, the energy spread on the high-energy side of the mean energy. The energy spread, or variance, is defined as the energy interval at the respective side of the mean energy covering a given percentage (typically 50% or 90%) of the beam intensity at that side. Cold field emitters generally emit an electron beam having an asymmetric energy distribution.

By high-pass energy filtering a beam having an asymmetric energy distribution, a portion of the beam having relatively low intensity but relatively high energy spread may be removed. Consequently, the total energy spread of the electron beam can be reduced considerably while not overly reducing the total beam intensity.

For example, using the data shown in FIG. 2, the energy spread of the beam can be narrowed from originally about 0.3 eV down to 0.2 eV if the lowest-energy 50% of the electrons are removed, and only the highest-energy 50% of the electrons are kept. The energy spread can even be reduced down to about 0.15 eV when the highest-energy 40% of the beam current is retained, and down to about 0.1 eV when the highest-energy 30% of the beam current are retained. In this application, terms such as "about" or "substantially" are meant to include tolerances of 5%.

In order to keep the above discussion simple, the energy distribution of the beam is assumed to be unchanged along the beam path between the emitter tip 12 and the retarding lens 30. Thus, scattering and interaction effects are neglected. However, the discussion can easily be extended to the case that the energy distribution is distorted e.g., due to electron-electron interactions and/or interactions with other parts of the apparatus 1.

As stated above, the high-pass condition for electrons passing the retarding lens can be stated as $E_{kin,cat} \geq E_{th} = e \times U_{saddle} - e \times U_{cat}$. Hence, in order for the retarding lens 30 to filter the electrons according to their energy $E_{kin}$ shown in FIG. 2 even when the cathode voltage $U_{cat}$ varies, the saddle voltage $U_{saddle}$ should be in a predetermined relation with the cathode voltage $U_{cat}$. In other words, the retarding voltage $U_{ret} = U_{saddle} + \Delta E_{saddle}/e$ should be in a predetermined relationship with the cathode voltage $U_{cat}$. In the following, the difference $U_{off} = U_{ret} \times U_{cat}$ is referred to as the offset voltage $U_{off}$.

The desired threshold energy $E_{th} = e \times (U_{saddle} - U_{cat})$ and $\Delta E_{saddle}$ are generally positive. Hence, the offset voltage $U_{off} = U_{ret} - U_{cat} = (E_{th} + \Delta E_{saddle})/e$ generally satisfies $U_{off} \leq 0$. In other words, the retarding voltage $U_{ret}$ is generally equal to or lower (i.e., more negative/less positive) than the cathode voltage $U_{cat}$.

Returning to FIG. 1, the electron beam apparatus 1 comprises a control system 60 having a first voltage supply 62 and a second voltage supply 64. The first voltage supply 62 is connected to the cold field emitter 12 for supplying the cathode voltage to the cold field emitter 12. The second voltage supply 64 is connected to the retarding lens 30 for supplying the retarding voltage to the retarding lens 30. In order for the retarding voltage to be in a predetermined relationship with the cathode voltage, the second voltage supply 64 is in communication with the first voltage supply 62. Namely, the second voltage supply 64 is realized as an offset voltage supply connected to the first voltage supply 62 and to the retarding lens 30 for supplying the retarding voltage as being offset, by the supplied offset voltage, with respect to the cathode voltage.

This arrangement is particularly advantageous, because compared to typical voltage differences of the order of kV even in LVSEMs, the offset voltage is very small, of the order of volts, if the threshold energy is to be in the region of the energy spread of the primary electron beam 14. In embodiments, the offset voltage is less than about 10 V, less than 3 V, and/or less than about an offset of the maximum energy of the electrons emitted by the cold field emitter with respect to the cathode voltage.

Typically, in the arrangement of FIG. 1, a large cathode voltage of the order of kV or more is applied to the first voltage supply 62, whereas only the small offset voltage of the order of V needs to be applied to the second voltage supply 64. This arrangement allows the offset voltage to be controlled accurately without regard to further large voltages applied in the apparatus 1.

Further embodiments for the control system 60 are equally possible. For example, the negative offset voltage difference can be applied between a pre-offset component of the control system 60 and the cold field emitter 12, and the second voltage supply is then realized by a wire connecting the pre-offset component with the retarding lens. Further, the first voltage supply 62 can be realized by an electrical connection to a fixed potential, e.g., ground potential, if other parts of the apparatus 1 are suitably biased. In this case, the offset voltage supply (e.g., supply 64) can be connected to the same potential, or to a potential having a predetermined relation with respect to that potential, whereby the second voltage supply 64 is automatically in communication with the first voltage supply 62.

Figure 5:
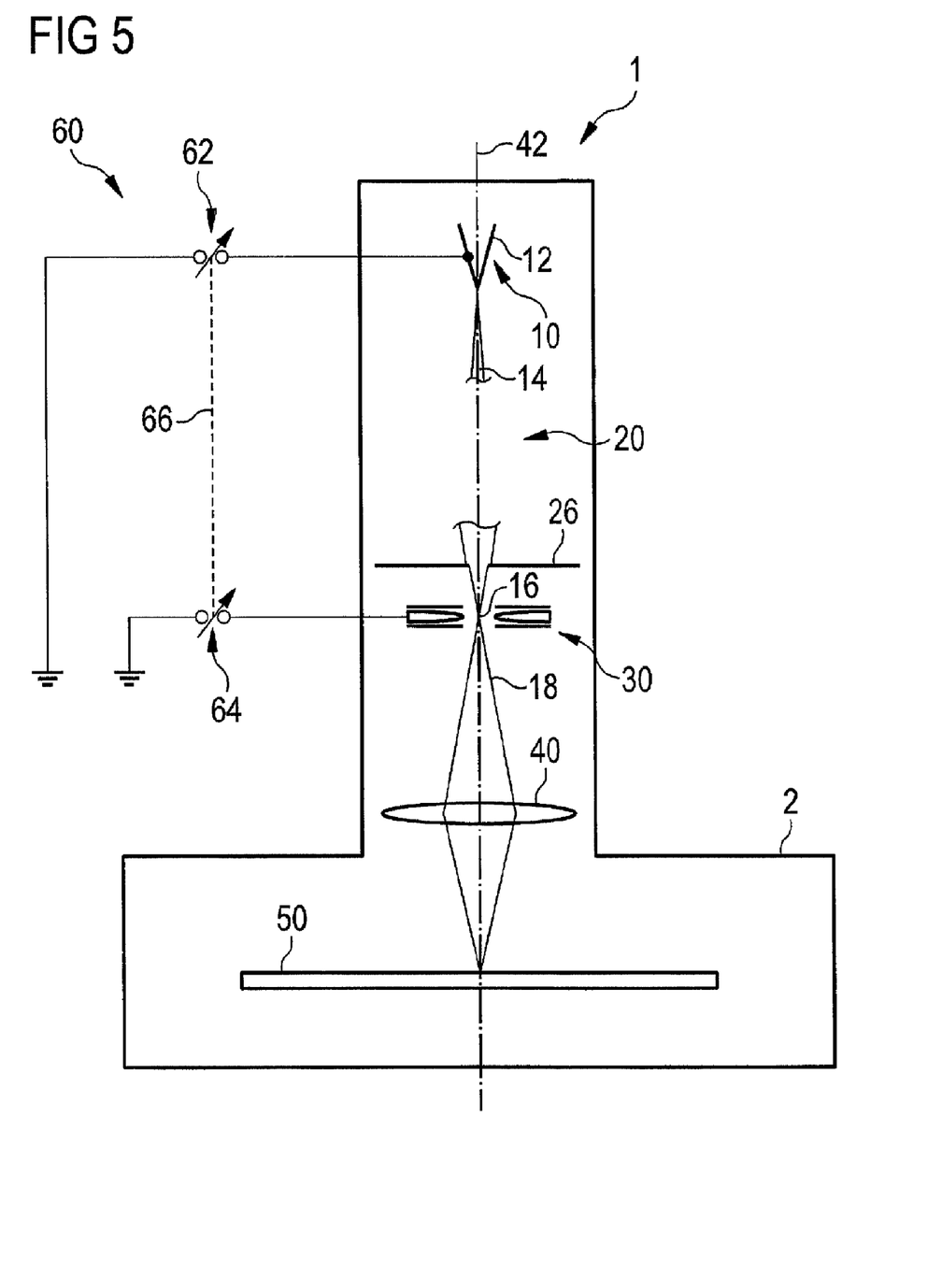
FIG. 5 shows a schematic view of a further embodiment of an electron beam apparatus.

Further, as is shown in FIG. 5, the first voltage supply 62 and the second voltage supply 64 can be realized as separate and individually tunable voltage supplies for the cold field electron emitter 12 and the retarding lens, respectively. In FIG. 5, a voltage-adjusting unit 66 is provided, which is in communication with the first voltage supply 62 and with the second voltage supply 64, and is adapted for adjusting the voltage supplied by the voltage supplies with respect to one another.

Thus, the voltage-adjusting unit 66 predetermines an offset voltage and controls the first voltage supply 62 to supply a first voltage and the second voltage supply 64 to supply a second voltage, such that the voltage difference between the first and the second voltage is equal to the predetermined offset voltage.

The voltage-adjusting unit 66 can be realized as a mechanic gage, i.e., a mechanic connection between the controls of the voltage supplies 62 and 64 ensuring that the respective voltages are controlled jointly, or as an electronic, e.g., digital, connection. Except for the above-described control system 60, the embodiment of FIG. 5 is analogous to that of FIG. 1.

It is to be understood that when it is stated that a voltage is supplied or applied to a unit, it is sufficient that the voltage is supplied or applied to some part of the unit, and not the entire unit, the latter being not necessarily at a constant potential.

As with any filter, the high-pass energy filtering of the retarding lens 30 is not ideal, but is somewhat blurred. An important factor contributing to the blurring is the cross-sectional extension of the primary electron beam 14, due to which not all electrons experience the same saddle potential and, hence, energy threshold. In order to reduce the blurring, the retarding lens 30 is advantageously placed, as shown e.g., in FIGS. 1 and 5, at a cross-over position 16 of the primary electron beam 14. More precisely, a retarding lens 30 interaction position of the primary electron beam 14 is at the cross-over position 16. The cross-over 16 may be generated by other beam-shaping means (not shown) such as condenser lenses, or by the retarding lens 30 itself. Generally, the cross-over is such that the electrons traversing the lens have a substantially symmetrical trajectory.

The retarding lens 30 may have the unwanted effect of increasing the energy and spatial spread of the primary electron beam 18 emerging from the filter due to increased electron-electron interactions at the cross-over 16, e.g., due to the Boersch effect. In order to minimize such unwanted interactions, it is advantageous placing the retarding lens 30, in primary electron beam direction, after a beam-limiting aperture, such as the aperture 26 shown in FIG. 1. Because in this arrangement the primary electron beam current is reduced, by the beam-limiting aperture 26, before entering the retarding lens 30, the unwanted electron-electron interaction effects can be reduced significantly. In embodiments, the beam-limiting aperture 26 is adapted for reducing the primary electron beam current by more than 50% and/or to less than 1 µA, 100 nA, or even 10 nA.

Further beam-shaping means such as energy or velocity filters, and/or further apertures, may be provided in addition to the elements shown in FIG. 1. The further beam shaping means may include lenses such as condenser lenses or objective lenses, beam scanning means, and other elements known in the art. The further beam shaping means may be arranged at any portion of the apparatus. Further, the apparatus 1 may comprise a secondary particle detecting system for secondary particles generated by the electron beam 18 impinging on the substrate 40.

Possible arrangements of elements of the apparatus 1 include the following cases, wherein the relations "before" and "after" are to be understood with respect to the primary electron beam direction: a condenser lens system and/or an accelerating anode portion can be placed before the retarding lens 30. An objective lens 40 and/or a specimen holder for a specimen 50 can be placed after the retarding lens 30.

Figure 6:
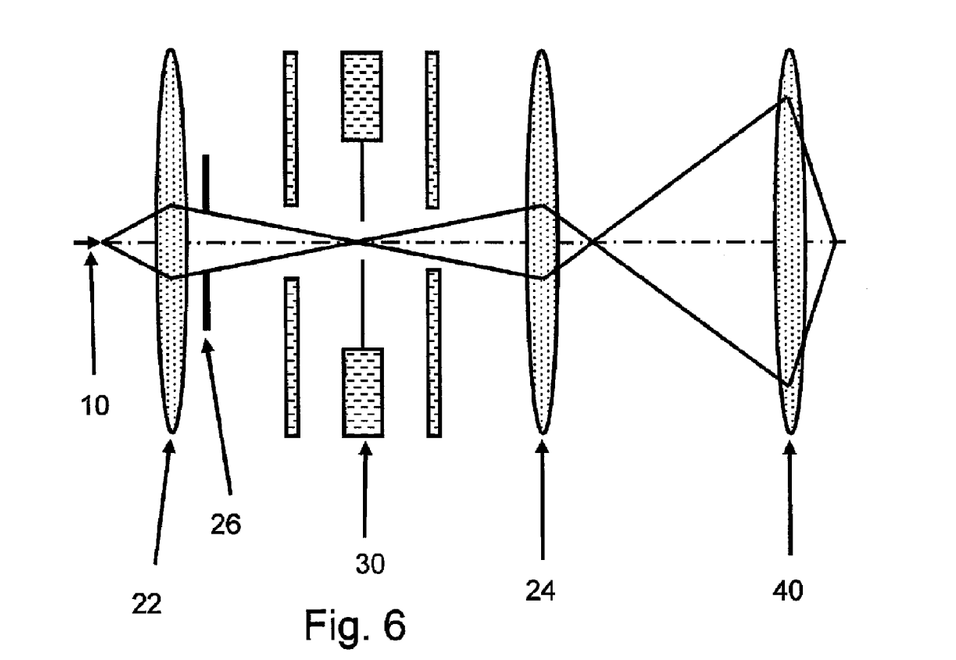
FIG. 6 shows parts of a further embodiment of an electron beam apparatus.
Figure 7:
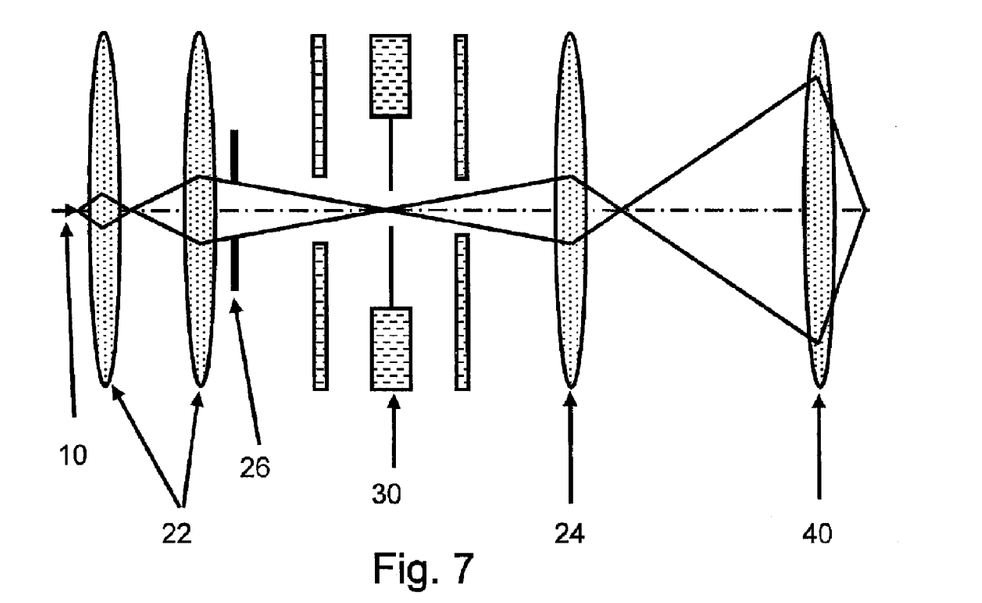
FIG. 7 shows parts of a still further embodiment of an electron beam apparatus.

With reference to FIGS. 6 and 7, particular embodiments having additional beam-shaping means are described. These embodiments have, in particular, a condenser lens system 22 placed between the electron source 10 and the aperture 26, and a demagnifying lens system 24 placed between the retarding lens 30 and the objective lens 40. Both the condenser lens system 22 and the demagnifying lens system 24 may comprise one, two, three or more lenses or lens stages. The lenses may be any electron lenses known in the art, e.g., electrostatic lenses. For example, in the arrangement of FIG. 6, both lens systems 22 and 24 comprise one lens. In the arrangement of FIG. 7, the condenser lens system 22 comprises two lenses, such that an additional cross-over (virtual source) can be generated between the lenses of the condenser lens system 22.

The electrons are typically slowed down considerably in the retarding lens and consequently are influenced by the lens potential for a relatively long time period. Consequently, the electron beam might undergo additional aberrations within the retarding lens if not all electrons are influenced in the same way. In order to reduce these aberrations, several counter-measures can be taken either individually or in combination.

One measure for reducing the aberrations is placing a beam cross-over 16 in the retarding lens 30 region, preferably at the center of the retarding lens (as also shown in FIG. 1). In this case, the achievable spot size in the cross-over inside the filter lens is generally in the range of several tens to several hundreds of nanometers (e.g., 10 nm-500 nm). In a particular embodiment, the minimum spot diameter in the cross-over 16 is about 60 nm. The cross-over 16 may be generated by the condenser lens system 22.

A further measure for reducing the aberrations is arranging the retarding lens such that the main beam path of the electron beam traverses the retarding lens at a central axis of the retarding lens, i.e., generally at or near a potential saddle point defined by the retarding lens 30. The alignment can be fine-tuned, if necessary, by an alignment element as described with reference to FIG. 1.

Still, there would remain a possible source of aberrations within the retarding lens due to the electrons entering the lens generally at an angle from the optical axis. If the potential of the retarding lens is not perfectly isotropic with respect to a cross-over-spot of the beam, electrons from different angles will generally undergo a different deflection due to the lens potential. In particular, they may pick up a transversal momentum depending on the incoming angle, which would result in aberrations.

Thus, the aberrations can further be reduced by the condenser lens system 22 upstream of the retarding lens. The condenser lens provides for a magnification of the electron beam source image on the retarding lens 30, which has the effect of reducing the angular spread of the electrons entering the retarding lens 30. A high magnification is achieved by e.g., placing the single condenser lens 22 of FIG. 6 sufficiently close to the electron source. For example, if $L_1$ is the distance between the (possibly virtual) electron source and the (middle of the) retarding lens 30, the lens 22 may be placed at a distance of less than $0.5 \times L_1$ from the electron source, and preferably at less than $0.3 \times L_1$ therefrom. Correspondingly, the demagnification lens 24 may be placed at a distance of less than $0.3 \times L_2$, preferably less than $0.1 \times L_2$ from the specimen plane, $L_2$ being the distance between the retarding lens 30 and the specimen plane. Thereby, the demagnification lens provides for a demagnification of the on the retarding lens 30 image on the specimen, thus at least partially compensating a magnification effect of the condenser lens 22.

As an additional consideration, the magnification and the demagnification of the lens systems 22 and 24 are advantageously adapted to the spot diameter, such as to minimize the loss of beam intensity. Thus, the condenser lens system 22 can be adapted to achieve a magnification between the electron source and the cross-over 16 (or the retarding lens 30) in the range of 2-100, depending on to the, possibly virtual, beam source size. For a cold field emitter 12, the magnification is typically about 5-40 times, e.g., 10 times. The demagnification is of the demagnification lens system 24 between the retarding lens and a specimen plane is generally in the range of 10-500, typically about 30-300 times, e.g., 100 times.

A further measure for reducing aberrations is adapting the retarding lens for providing a potential with a high degree of isotropy (see below).

In alternative embodiments, a stigmatic cross-over 16 may be avoided, e.g., by providing an extended image of the electron beam source at the position of the retarding lens 30. Preferably, the image is astigmatic. In these embodiments, instead of being focused onto a cross-over spot 16, the electrons may traverse the retarding lens 30 in an extended lateral region, e.g., a line- or oval-shaped lateral region.

To this purpose, any of the embodiments disclosed herein can be adapted as follows: an additional cylinder lens is placed, as an astigmatic lens, in primary beam direction before the retarding lens 30, in order to provide the astigmatic image. The retarding lens 30 may also be provided as a cylinder lens in order to provide a retarding potential that is adapted to the astigmatic beam shape. A further cylinder lens is placed, as an astigmatic lens, after the retarding lens 30, in order to compensate for the astigmatism of the preceding astigmatic lenses, and to make the beam stigmatic again.

Alternatively, instead of providing separate astigmatic lenses, lenses or beam-shaping means that are already present can be modified to provide for the astigmatic properties. Further, other lens aberrations may be used in order to provide an extended image of the electron beam source at the position of the retarding lens 30, e.g., chromatic aberrations.

In the following, the retarding lens 30 is described in more detail in connection with FIG. 3. The retarding lens is an electrostatic lens or has at least an electrostatic lens component. The retarding lens 30 of FIG. 3 comprises three electrodes 32, 34, 36. The above-mentioned retarding potential is typically applied to the middle electrode 34, whereas the further electrodes 32 and 36 are supplied for screening the field of the middle electrode 34, and for assisting the retardation action, i.e., an intermediate deceleration followed by an intermediate acceleration action, of the retarding lens 30. The electrodes of the retarding lens 30 may have a distance of, for example, 10 mm, 15 mm or 20 mm, but this distance may vary depending on the overall design. The electrodes may be controlled such that the outgoing high-pass filtered beam is not substantially accelerated or decelerated with respect to the incoming beam, but may alternatively be controlled for providing a net acceleration or deceleration. Depending on the details of the desired accelerating, decelerating, and/or retarding action of the lens, more electrodes than three may be provided.

In order to provide a retarding lens potential with a high degree of isotropy, an electrostatic lens with small spherical aberration, e.g., an Einzel lens, is preferred. In particular, the retarding voltage may be applied axially symmetrically around the optical axis. However, it is also possible to apply the voltage asymmetrically. Further, the retarding lens is preferably a hyperbolic lens, i.e., the lens electrodes are arranged for producing a saddle point electrostatic potential field.

The retarding lens 30 electrodes have a central opening at the optical axis 12 for the electron beam 14.

The voltage supply for the retarding lens 30 is operable to turn the retarding lens 30 to an "off" state, i.e., to turn off a filtering action of the retarding lens. This is achieved by applying a predetermined voltage to the retarding lens, and preferably by supplying the same potential to all electrodes. The predetermined voltage is of the order of the voltage of other nearby elements, e.g., of the aperture 26, and may be ground voltage. The "off" state allows for a high current and low-resolution mode.

Figure 4:
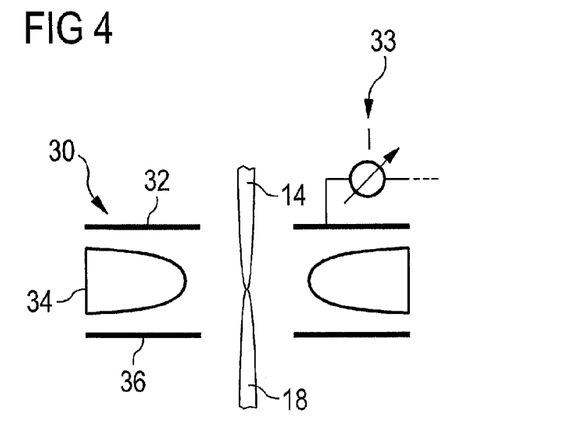
FIG. 4 shows an enlarged view of the parts of a further embodiment of an electron beam apparatus.

FIG. 4 shows an enlarged view of the parts of a further embodiment of an electron beam apparatus. Therein, a current detector 33 is attached to the first electrode 32 of the retarding lens 30. The electrode 32 acts as a collector 32 for collecting electrons that have been reflected by the retarding lens 30. Alternatively, the collector can be provided as a separate unit (not shown). The collector is generally arranged, in primary electron beam direction, before the retarding lens 30 or at least before a retarding electrode 34 of the retarding lens 30.

The current detector 33 allows measuring electrons that are reflected by the retarding lens 30, in particular a current generated by the electrons. The signal from the measured electrons allows deducing information about the energy distribution and the energy spread of the filtered and unfiltered electron beam.

An alternative collector/detector combination may be provided, e.g., by any other electron detecting device such as a scintillation detector or a Faraday detector. Further, only a collector may be provided for removing the reflected electrons, without a detector.

While the current detector 33 of FIG. 4 is provided within the retarding lens 30, this need not be the case. In alternative embodiments, a detector for the reflected electrons may be provided e.g., in primary beam direction before the retarding lens 30. The reflected electrons tend to be approximately back-reflected, i.e., to follow the primary electron beam 14 trajectory in reverse direction. Therefore, it is advantageous to include a beam separation element for separating the reflected electrons from the primary beam 14 electrons before the retarding lens 30. The beam separation means may be realized by a Wien filter or by some other velocity-dependent deflection element (e.g., multiple magnetic deflectors). The reflected-electron detector may then be positioned, in reflected-beam direction, after the beam separation means.

Alternatively or in addition to the reflected current detector, a detector for the beam portion transmitted through the retarding lens may be provided. The detector may be any primary beam detector known from other charged-particle beam devices.

The advantages of the retarding lens 30 is that it provides an energy filter that is efficient, easy to realize, low in cost, and that allows for a small energy spread while not overly reducing the current.

While the foregoing is directed to embodiments of the invention, other and further embodiments of the invention may be devised without departing from the basic scope thereof. For example, the present invention can be applied for apparatuses and components using, instead of electrons, other sources of charged particles, e.g., ions.

The invention claimed is:

1. A method for providing an energy-filtered primary electron beam comprising:
   generating a primary electron beam having an asymmetric first energy distribution by means of an electron source; and
   high-pass energy filtering the primary electron beam using a retarding lens.

2. The method according to claim 1, wherein the generating of the primary electron beam comprises utilizing a cold field emission electron source.

3. The method according to claim 1, further comprising:
   reducing an intensity of the primary electron beam by means of a beam-limiting aperture prior to the high-pass energy filtering stage.

4. The method according to claim 3, wherein the stage of reducing comprises reducing the intensity of the primary electron beam by more than 50%.

5. The method according to claim 1, further comprising:
   predetermining an offset voltage;
   applying a first voltage to an electron emitter of the electron source; and
   applying a second voltage to the retarding lens, wherein:
   the first voltage and the second voltage are controlled to have a voltage difference equal to the predetermined offset voltage.

6. The method according to claim 5, wherein the second voltage does not substantially exceed the first voltage, and wherein the offset voltage is equal or less than 10 V.

7. The method according to claim 5, further comprising generating the second voltage by adding the predetermined offset voltage to the first voltage.

8. The method according to claim 1, further comprising: collecting electrons that are reflected by the retarding lens.

9. The method according to claim 1, further comprising: generating a cross-over of the primary electron beam at a retarding lens interaction position of the primary electron beam.

10. The method according to claim 1, further comprising:
    transmitting the primary electron beam through a condenser lens system for magnifying the primary electron beam, a condenser lens of the condenser lens system being placed at a distance of less than $0.5 \times L_1$ from the electron source, $L_1$ being a distance between the electron source and the retarding lens; and
    transmitting the primary electron beam through a demagnifying lens system for demagnifying the primary electron beam, a demagnifying lens of the demagnifying lens system being placed at a distance of less than $0.3 \times L_2$ from a specimen plane, $L_2$ being the distance between the retarding lens and the specimen plane.

11. An electron beam apparatus comprising:
- a cold field emission electron source for providing a primary electron beam, the cold field emission electron source comprising a cold field emitter;
- a retarding lens adapted to be a high-pass energy filter for the primary electron beam;
- a first voltage supply for supplying a first voltage to the cold field emitter; and
- a second voltage supply connected to the retarding lens for supplying a second voltage to the retarding lens, the second voltage supply being in communication with the first voltage supply.

12. The electron beam apparatus of claim 11, wherein the second voltage does not substantially exceed the first voltage, and wherein the difference between the second voltage and the first voltage is less than about 10 V.

13. The electron beam apparatus of claim 11, wherein the second voltage supply comprises an offset voltage supply connected to the first voltage supply and to the retarding lens for supplying the second voltage as being offset, by the offset voltage, with respect to the first voltage.

14. The electron beam apparatus of claim 11, further comprising a voltage-adjusting unit in communication with the first voltage supply and with the second voltage supply, the voltage-adjusting unit being adapted for adjusting the first voltage and the second voltage with respect to one another.

15. The electron beam apparatus of claim 11, further comprising a beam-limiting aperture for the primary electron beam, wherein the retarding lens is placed, in primary electron beam direction, after the beam-limiting aperture.

16. An electron beam apparatus comprising:
- a cold field emission electron source for providing a primary electron beam;
- a beam-limiting aperture for the primary electron beam; and
- a retarding lens placed, in primary electron beam direction, after the beam-limiting aperture, the retarding lens being adapted to be a high-pass energy filter for the primary electron beam.

17. The electron beam apparatus of claim 16, wherein the beam-limiting aperture is adapted for reducing the primary electron beam current by more than 50%.

18. The electron beam apparatus of claim 16, further comprising a condenser lens system for the primary electron beam, wherein the retarding lens is placed, in primary electron beam direction, after the condenser lens system.

19. The electron beam apparatus of claim 16, wherein:
- a condenser lens of a condenser lens system is placed at a distance of less than $0.5 \times L1$ from the electron source, $L1$ being the distance between the electron source and the retarding lens, and wherein:
- a demagnifying lens of a demagnifying lens system is placed at a distance of less than $0.3 \times L_2$ from a specimen plane, $L_2$ being the distance between the retarding lens and the specimen plane.

20. The electron beam apparatus of claim 16, further comprising an objective lens for the primary electron beam placed, in primary electron beam direction, after the retarding lens.

21. The electron beam apparatus of claim 16, wherein the retarding lens is adapted for reflecting electrons of the primary electron beam having a substantially lower energy than a predetermined threshold energy.

22. The electron beam apparatus of claim 16, wherein the retarding lens comprises at least three electrodes.

23. The electron beam apparatus of claim 16, comprising a collector for collecting electrons that are reflected by the retarding lens.

24. The electron beam apparatus of claim 16, wherein the retarding lens is placed at a cross-over position of the primary electron beam.

25. The electron beam apparatus of claim 16, being a scanning electron microscope.

* * * * *